(12) United States Patent
Hwang et al.

(10) Patent No.: US 10,804,234 B2
(45) Date of Patent: Oct. 13, 2020

(54) SEMICONDUCTOR DEVICE HAVING A BOUNDARY STRUCTURE, A PACKAGE ON PACKAGE STRUCTURE, AND A METHOD OF MAKING

(71) Applicant: Taiwan Semiconductor Manufacturing Co., Ltd., Hsin-Chu (TW)

(72) Inventors: Chien Ling Hwang, Hsinchu (TW); Yeong-Jyh Lin, Caotun Township (TW); Bor-Ping Jang, Chu-Bei (TW); Hsiao-Chung Liang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/382,503

(22) Filed: Apr. 12, 2019

(65) Prior Publication Data

US 2019/0237422 A1    Aug. 1, 2019

Related U.S. Application Data

(60) Continuation of application No. 15/596,392, filed on May 16, 2017, now Pat. No. 10,276,531, which is a
(Continued)

(51) Int. Cl.
*H01L 25/10* (2006.01)
*H01L 23/14* (2006.01)
(Continued)

(52) U.S. Cl.
CPC .......... *H01L 24/14* (2013.01); *H01L 21/4853* (2013.01); *H01L 23/147* (2013.01); *H01L 23/49811* (2013.01); *H01L 25/105* (2013.01); *H01L 24/29* (2013.01); *H01L 24/32* (2013.01);
*H01L 2224/2919* (2013.01); *H01L 2224/32225* (2013.01); *H01L 2225/1023* (2013.01);
(Continued)

(58) Field of Classification Search
CPC ... H01L 24/14; H01L 25/105; H01L 21/4853; H01L 23/147; H01L 2225/1023; H01L 24/32; H01L 24/29
USPC .......... 257/686, 734, 737, 738; 438/108, 109
See application file for complete search history.

(56) References Cited

U.S. PATENT DOCUMENTS 5,612,576 A * 3/1997 Wilson et al. ...... H01L 23/3128
257/788
6,432,807 B1    8/2002 Tsukui et al.
(Continued)

OTHER PUBLICATIONS

Non-Final Office Action dated Jul. 27, 2015 for U.S. Appl. No. 14/021,441.
(Continued)

*Primary Examiner* — Thinh T Nguyen
(74) *Attorney, Agent, or Firm* — Eschweiler & Potashnik, LLC

(57) ABSTRACT

The present disclosure, in some embodiments, relates to a semiconductor structure. The semiconductor structure includes a substrate and a first conductive pad arranged over the substrate. A boundary structure is on an upper surface of the substrate around the first conductive pad. The boundary structure has one or more sidewalls defining an opening with a round shape over the first conductive pad.

20 Claims, 11 Drawing Sheets

Related U.S. Application Data division of application No. 14/021,441, filed on Sep. 9, 2013, now Pat. No. 9,659,891.

(51) Int. Cl.
*H01L 23/00* (2006.01)
*H01L 23/498* (2006.01)
*H01L 21/48* (2006.01)

(52) U.S. Cl.
CPC ................ *H01L 2225/1058* (2013.01); *H01L 2924/157* (2013.01); *H01L 2924/1579* (2013.01); *H01L 2924/15311* (2013.01); *H01L 2924/15331* (2013.01); *H01L 2924/181* (2013.01); *H01L 2924/18161* (2013.01); *H01L 2924/3841* (2013.01)

(56) References Cited

U.S. PATENT DOCUMENTS

| | | |
|---|---|---|
| 6,821,878 B2 | 11/2004 | Danvir et al. |
| 7,245,008 B2 | 7/2007 | Lee |
| 7,667,336 B2 | 2/2010 | Ishio |
| 7,902,648 B2 | 3/2011 | Lee |
| 7,928,557 B2 | 4/2011 | Oi et al. |
| 8,330,277 B2 | 12/2012 | Machida |
| 8,525,318 B1 | 9/2013 | Kim et al. |
| 2004/0134974 A1 | 7/2004 | Oh et al. |
| 2004/0169275 A1 | 9/2004 | Danvir et al. |
| 2006/0175690 A1 | 8/2006 | Lee |
| 2007/0290376 A1 | 12/2007 | Zhao et al. |
| 2008/0036086 A1 | 2/2008 | Ishio |
| 2008/0061437 A1 | 3/2008 | Kohara et al. |
| 2008/0093749 A1 | 4/2008 | Gerber et al. |
| 2008/0179738 A1 | 7/2008 | Nishimura et al. |
| 2009/0133915 A1 | 5/2009 | Higashitani et al. |
| 2010/0052186 A1 | 3/2010 | Appelt et al. |
| 2010/0108371 A1 | 5/2010 | Furutani et al. |
| 2010/0206621 A1* | 8/2010 | Wada ............ H01L 2224/16225 174/156 |
| 2011/0156264 A1* | 6/2011 | Machida ............ H01L 21/4846 257/773 |
| 2012/0074578 A1 | 3/2012 | Kobayashi et al. |
| 2015/0069604 A1 | 3/2015 | Hwang et al. |

OTHER PUBLICATIONS

Final Office Action dated Feb. 5, 2016 for U.S. Appl. No. 14/021,441.
Non-Final Office Action dated Aug. 11, 2016 for U.S. Appl. No. 14/021,441.
Notice of Allowance dated Jan. 17, 2017 for U.S. Appl. No. 14/021,441.
Non-Final Office Action dated Sep. 25, 2018 for U.S. Appl. No. 15/596,392.
Notice of Allowance dated Feb. 14, 2019 for U.S. Appl. No. 15/596,392.

* cited by examiner

SEMICONDUCTOR DEVICE HAVING A BOUNDARY STRUCTURE, A PACKAGE ON PACKAGE STRUCTURE, AND A METHOD OF MAKING

REFERENCE TO RELATED APPLICATIONS

This Application is a Continuation of U.S. application Ser. No. 15/596,392, filed on May 16, 2017, which is a Divisional of U.S. application Ser. No. 14/021,441, filed on Sep. 9, 2013 (now U.S. Pat. No. 9,659,891, issued on May 23, 2017). The contents of the above-referenced Patent Applications are hereby incorporated by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIGS. 2A(b) and 2B(b) are cross-sectional view of an I/O area of a semiconductor device in accordance with one or more embodiments;

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1A:
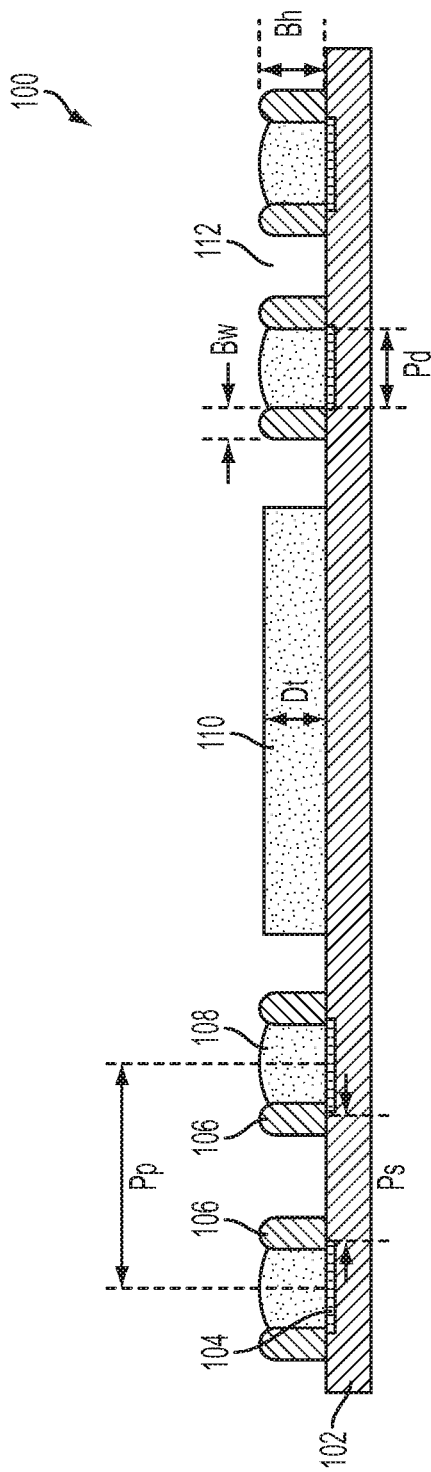
FIG. 1A is a cross-sectional view of a semiconductor device including a boundary structure in accordance with one or more embodiments.

FIG. 1A is a cross-sectional view of a semiconductor device 100 including a boundary structure 106 in accordance with one or more embodiments. Semiconductor device 100 includes a substrate 102 having a conductive pad 104 on a top surface of the substrate. A boundary structure 106 is over substrate 102. A conductive solder 108 is electrically connected to conductive pad 104. Conductive solder 108 is formed in an opening in boundary structure 106, so that the boundary structure separates a conductive solder 108 from an adjacent conductive bump. Semiconductor device also includes a die 110 over the top surface of substrate 102. A space 112 is located between adjacent boundary structures 106 which are not around conductive pad 104.

In some embodiments, substrate 102 comprises an elementary semiconductor including silicon or germanium in a crystal, a polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 102 is an organic substrate. In some embodiments, the organic substrate includes polyimide. In some embodiments, the organic substrate includes fiber-filled cores and build-up layers.

Conductive pad 104 is on the top surface of substrate 102. In some embodiments, conductive pad 104 is a top metal layer of an interconnect structure on substrate 102. In some embodiments, conductive pad 104 is over the top surface of substrate 102. In some embodiments, conductive pad 104 is connected to an interconnect structure to provide electrical connection to a bottom surface of substrate 102 opposite the top surface. In some embodiments, conductive pad 104 includes copper, aluminum, titanium, alloys thereof or other suitable conductive materials. In some embodiments, conductive pad 104 is formed using physical vapor deposition (PVD), electroplating, sputtering, atomic layer deposition (ALD) or another suitable formation process.

A diameter Pd of conductive pad 104 ranges from about 50 microns (.mu.m) to about 200 .mu.m. If diameter Pd of conductive pad 104 is too small, an electrical resistance of the conductive pad reduces effective electrical signal transfer through the conductive pad, in some instances. If diameter Pd of conductive pad 104 is too great, a size of semiconductor device 100 is increased resulting in an over increase in a size of a final product formed, in some instances. A pad spacing Ps between adjacent conductive pads 104 ranges from about 40 .mu.m to about 175 .mu.m. If pad spacing Ps is too small, a parasitic capacitance between the adjacent conductive pads 104 reaches an unacceptable level, in some instances. If pad spacing Ps is too great, a size of semiconductor device 100 is increased resulting in an over increase in a size of a final product formed, in some instances.

A pitch Pp between adjacent conductive pads 104 ranges from about 50 .mu.m to about 200 .mu.m. If pad spacing Pp is too small, a parasitic capacitance between the adjacent conductive pads 104 reaches an unacceptable level and a risk of bridging during a bonding process increases, in some instances. If pad spacing Pp is too great, a size of semiconductor device 100 is increased resulting in an over increase in a size of a final product formed, in some instances.

Boundary structure 106 is located between adjacent conductive pads 104. Boundary structure 106 is configured to prevent adjacent conductive solder 108 from bridging with one another during a packaging process. In some embodiments, boundary structure 106 is a non-conductive material. In some embodiments, boundary structure 106 is a polymer material. In some embodiments, boundary structure is a silicon-based adhesive compound. In some embodiments, the boundary structure comprises SFX8358 produced by Sil-more Industrial Ltd.

In some embodiments, boundary structure 106 is formed using a printing process, a screening process, or another suitable formation process. In some embodiments, the printing process includes using a nozzle to spray the boundary structure material onto substrate 102. In some embodiments, a screening process includes dropping solder balls through openings in a mask or stencil where the openings correspond to conductive pads 104. In some embodiments, boundary structure 106 is formed by a pasting process. The pasting process includes pressing a boundary structure material through a stencil onto substrate 102.

In some embodiments, a top surface of boundary structure 106 is rounded due to a surface tension of the boundary structure material. In some embodiments, boundary structure 106 has a viscosity greater than 100,000 mega Pascals (MPa) in order for the boundary structure to maintain a selected height without spreading across a surface of substrate 102 or conductive pad 104. In some embodiments, boundary structure 106 has a resistivity greater than or equal to about $1.6 \times 10^{15}$ ohm*cm in order to provide sufficient electrical resistance to prevent bridging in embodiments were boundary structures 106 contact one another. In some embodiments, a Young's Modulus of boundary structure 106 ranges from about 0.1 MPa to about 500 MPa. In some embodiments, the Young's Modulus of boundary structure 106 is greater than or equal to about 1.54 MPa in order to prevent the boundary structure from compressing during a bonding process and reducing an ability to inhibit bridging. In some embodiments, boundary structure 106 is capable of withstanding a reflow temperature ranging from about 260.degree. C. to about 280.degree. C. without sustaining significant damage.

In the embodiment of FIG. 1A, boundary structures 106 are aligned with an outer edge of conductive pad 104. In some embodiments, boundary structures 106 partially overlap a portion of conductive pad 104. In some embodiments, boundary structures 106 are spaced from conductive pad 104.

A height Bh of boundary structure 106 ranges from about 10 .mu.m to about 100 .mu.m. If height Bh is too small, boundary structure 106 will be incapable of effectively preventing bridging between adjacent conductive solder 108, in some instances. If height Bh is too great, boundary structure 106 will prevent conductive solder 108 from forming an electrical bond during formation of a package on package (PoP) structure, in some instances. A width Bw of boundary structure 106 ranges from about 30 .mu.m to about 200 .mu.m. In some embodiments, width Bw is less than diameter Pd. In some embodiments, width Bw is less than 1.5 times diameter Pd. In some embodiments, width Bw is less than 1.5 times pad spacing Ps. In some embodiments, width Bw divided by height Bh is greater than or equal to 2. If width Bw is too small, boundary structure 106 will not have sufficient mechanical strength to prevent conductive bump from breaking through the boundary structure during a packaging process, in some instances. If width Bw is too great, pad spacing Ps is increased to the point of increasing the size of semiconductor device 100, in some instances.

Conductive solder 108 is configured to electrically connect conductive pad 104 to another device. In some embodiments, conductive solder 108 is electrically connected to another conductive bump on the bottom surface of substrate 102 through conductive pad 104 and a conducting via.

In some embodiments, conductive solder 108 is replaced with a different type of conductive element such as a copper bump, a copper pillar, a metal bump including nickel or gold, or another suitable conductive element. In some embodiments, conductive solder 108 includes a lead-free pre-solder layer, SnAg, or a solder material including alloys of tin, lead, silver, copper, nickel, bismuth, or combinations thereof. In some embodiments, conductive solder 108 is formed by plating a solder layer using photolithography technologies followed by reflow processes.

Die 110 includes active circuitry. In some embodiments, die 110 is a processor. In some embodiments, die 110 is a memory device. In some embodiments, die 110 includes other types of circuitry. Die 110 is on the top surface of substrate 102. In some embodiments, die 110 is electrically connected to an interconnect structure within substrate 102. In some embodiments where substrate 102 does not include circuitry, die 110 is adhered to the top surface of substrate 102. In some embodiments, die 110 is electrically connected to conductive solder 108. In some embodiments, die 110 is electrically connected to the bottom surface of substrate 102 through conducting via.

Die 110 has a die thickness Dt ranging from 50 .mu.m to 300 .mu.m. In some embodiments, die thickness Dt is greater than height Bh. In some embodiments, die thickness Dt is less than or equal to height Bh. In some embodiments, height Bh is less than twice die thickness Dt. If die thickness Dt is too great, e.g., greater than twice a thickness of conductive solder 108, die 110 prevents conductive solder 108 from electrically connecting with a bump structure in another substrate, in some instances. If die thickness Dt is too small, die 110 is difficult to manufacture.

Figure 1B:
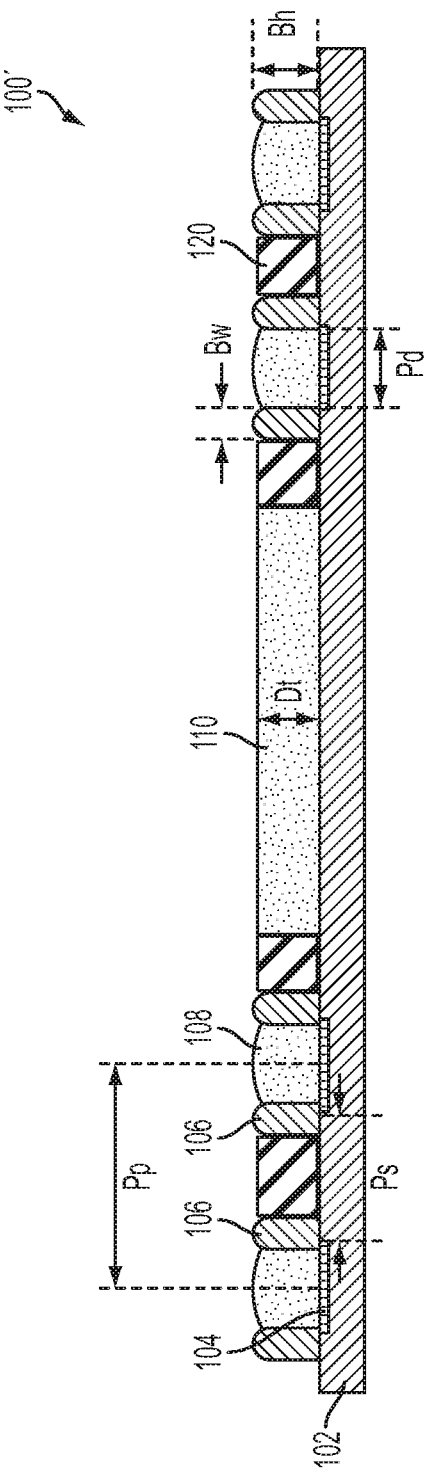
FIG. 1B is a cross-sectional view of a semiconductor device including a boundary structure in accordance with one or more embodiments.

FIG. 1B is a cross-sectional view of a semiconductor device 100' including a boundary structure in accordance with one or more embodiments. Semiconductor device 100' is similar to semiconductor device 100, except that semiconductor device 100' includes a molding compound 120 between portions of boundary structure 106. Semiconductor device 100' also differs from semiconductor device 100 in that boundary structures 106 in semiconductor device 100' partially overlap with conductive pads 104.

Molding compound 120 provides increased mechanical strength to substrate 102 during a bonding process. In some embodiments, a material of molding compound 120 includes epoxy resin mold compound. In some embodiments, molding compound 120 includes plastics, resins, epoxies, adhesives, hardeners, catalysts, release agents, or other suitable materials In some embodiments, molding compound 120 additional includes fillers used to adjust the coefficient of thermal expansion ("CTE"), control moisture absorption, and control elasticity or modulus of the finished mold compound. In some embodiments, a height of molding compound is greater than height Bh. In some embodiments, the height of molding compound 120 is less than or equal to height Bh. In some embodiments, molding compound 120 is between each pair of adjacent boundary structures 106 which do not surround conductive pad 104. In some embodiments, molding compound 120 is between die 110 and adjacent boundary structure 106. In some embodiments, molding compound 120 is between only a portion of adjacent boundary structures 106.

Boundary structure 106 helps to prevent bridging between adjacent conductive solder 108 during a packaging process. During a packaging process, the conductive solder 108 is melted and the BGA of top package introduces more solder material, which tends to cause conductive solder 108 to expand outwardly during the packaging process. If two conductive solder 108 contact one another, a bridge is formed. The bridge enables electrical signals from one conductive solder 108 to travel to an adjacent conductive solder 108 unintentionally. The result is that the electrical signals are received by incorrect circuitry and result in a non-functional device, in some instances. Boundary structure 106 acts to prevent the outward expansion of conductive solder 108 to reduce the risk of bridging. As a result, pad pitch Pp is able to be reduced. In some embodiments, pad pitch Pp ranges from about 50 .mu.m to about 200 .mu.m. In contrast, a pitch between adjacent conductive pads in a semiconductor device which does not include boundary structure 106 is greater than 0.3 millimeters (mm).

The lower pad pitch Pp impacts a number of I/O connecting top and bottom packages. For example, under the same package footprint, the reduced pad pitch Pp allows for a significant increasing in number of I/O which enhances the function of the PoP package. In another example, a number of I/O connections is increased, but the size of the I/O area remains constant. In some embodiments, semiconductor device 100 includes at least 500 connection locations.

Figure 2A:
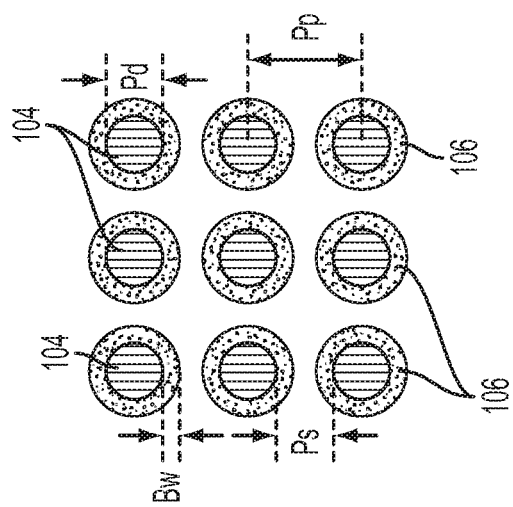
FIGS. 2A(a) and 2B(a) are top views of an input/output (I/O) area of a semiconductor device in accordance with one or more embodiments.
Figure 2A:
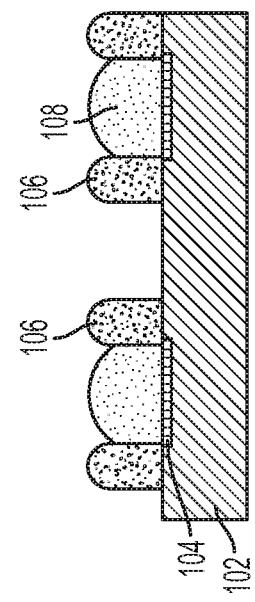

FIG. 2A(a) is a top view of an input/output (I/O) area of a semiconductor device in accordance with one or more embodiments. In the arrangement of FIG. 2A, boundary structure 106 concentrically surrounds conductive pad 104. In the arrangement of FIG. 2A(a), conductive pad 104 and boundary structure 106 are circular. In some embodiments, boundary structure 106 and conductive pad 104 have a shape other than circular. A space exists between adjacent boundary structures 106 where the I/O area is free of the boundary structure material. Sidewalls of boundary structure 106 are aligned with sidewalls of conductive pad 104. Boundary structure 106 does not overlap with conductive pad 104. FIG. 2A(b) is a cross-sectional view of the I/O area of the semiconductor device of FIG. 2A(a). FIG. 2A(b) is portion of FIG. 1A corresponding to the I/O area.

Figure 2B:
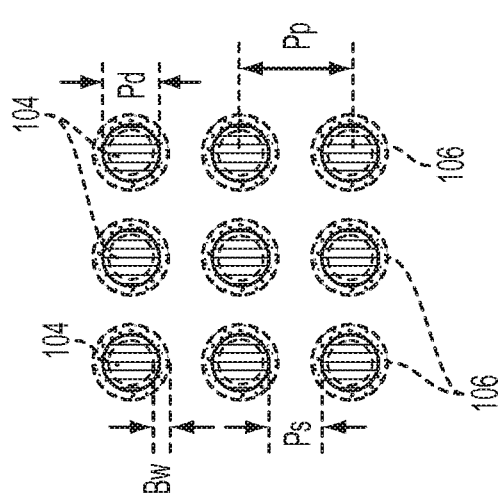
FIG. 2C-2E are top views of an I/O area of a semiconductor device in accordance with one or more embodiments.
Figure 2B:
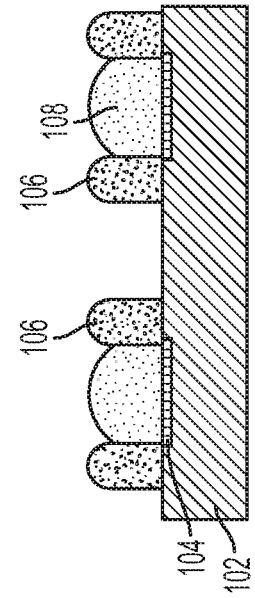

FIG. 2B(a) is a top view of an I/O area of a semiconductor device in accordance with one or more embodiments. In the arrangement of FIG. 2B(a), boundary structure 106 concentrically surrounds conductive pad 104. In the arrangement of FIG. 2B(a), conductive pad 104 and boundary structure 106 are circular. In some embodiments, boundary structure 106 and conductive pad 104 have a shape other than circular. A space exists between adjacent boundary structure 106 where the I/O area is free of the boundary structure material. Boundary structure 106 overlaps with conductive pad 104. In some embodiments, boundary structure 106 overlaps from about 25% to about 80% of a surface of conductive pad 104. FIG. 2B(b) is a cross-sectional view of the I/O area of the semiconductor device of FIG. 2B(a). FIG. 2B(b) is portion of FIG. 1B corresponding to the I/O area.

Figure 2E:
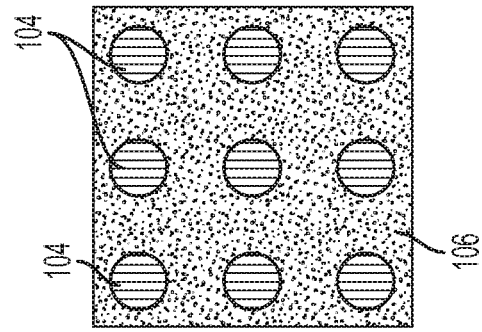
Figure 2D:
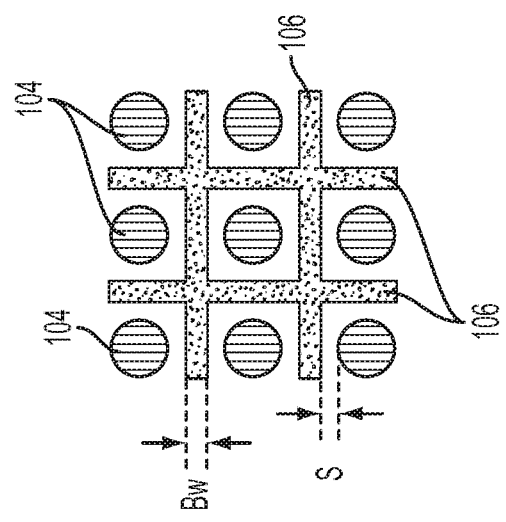
Figure 2C:
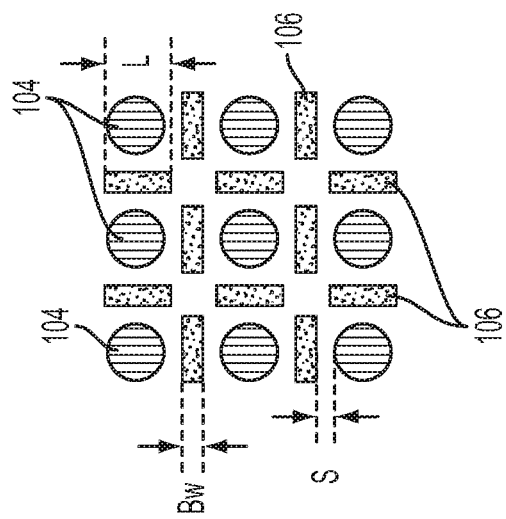

FIG. 2C is a top view of an I/O area of a semiconductor device in accordance with one or more embodiments. In the arrangement of FIG. 2C, boundary structure 106 is arranged in a discontinuous grid pattern between adjacent conductive pads 104. In the arrangement of FIG. 2C, boundary structure 106 is rectangular. In some embodiments, boundary structure 106 has a shape other than rectangular. In some embodiments, a length L of boundary structure 106 is greater than ¼ of pad diameter Pd. In some embodiments, length L ranges from about 15 .mu.m to about 70 .mu.m. A space S exists between boundary structure 106 and conductive pads 104 where the I/O area is free of the boundary structure material. In some embodiments, space S ranges from about 10 .mu.m to about 50 .mu.m. The grid pattern is discontinuous because an interruption exits at an intersection of a vertical portion and a horizontal portion of boundary structure 106. In some embodiments, the grid pattern includes an interruption in a location other than at the intersection between the vertical portion and the horizontal portion of boundary structure 106.

FIG. 2D is a top view of an I/O area of a semiconductor device in accordance with one or more embodiments. In the arrangement of FIG. 2D, boundary structure 106 is arranged in a continuous grid pattern between adjacent conductive pads 104. In the arrangement of FIG. 2D, boundary structure 106 is rectangular. In some embodiments, boundary structure 106 has a shape other than rectangular. A space exists between boundary structure 106 and conductive pads 104 where the I/O area is free of the boundary structure material. The grid pattern is a continuous pattern intersecting at right angles. In some embodiments, the grid pattern intersects at angles other than right angles.

FIG. 2E is a top view of an I/O area of a semiconductor device in accordance with one or more embodiments. In the arrangement of FIG. 2E, boundary structure 106 is arranged to cover an entirety of the I/O area not occupied by conductive pads 104. In some embodiments, boundary structure 106 ends at an edge of the I/O area and does not contact die 110. In some embodiments, an amount of the I/O area covered by boundary structure 106 ranges from 50% to 100% of the I/O area. In some embodiments, boundary structure material is formed by passing material through a screen to facilitate selective deposition of the boundary structure.

Figure 3A:
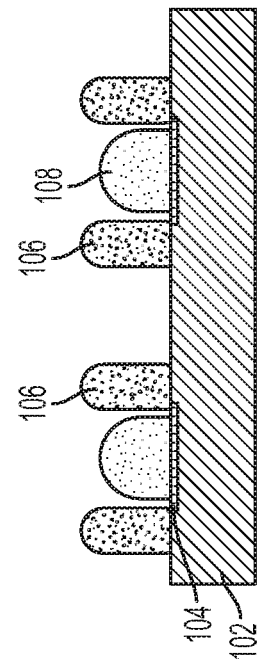
FIGS. 3A-3D are cross-sectional views of an I/O area of a semiconductor device in accordance with one or more embodiments.

FIG. 3A is a cross-sectional view of an I/O area of a semiconductor device in accordance with one or more embodiments. In the arrangement of FIG. 3A, boundary structure 106 is in contact with conductive solder 108. In some embodiments, sidewalls of boundary structure 106 are aligned with an edge of conductive pad 104. In some embodiments, boundary structure 106 overlaps a portion of conductive pad 104. In some embodiments, boundary structure 106 covers an entirety of the I/O area not covered by conductive pads 104. A height of conductive solder 108 is selected so that following a bonding process, the conductive solder has sufficient height to form an electrical connection with a conductive element on a second semiconductor device. In the arrangement of FIG. 3A, height Bh is greater than a height of conductive solder 108. In some embodiments, height Bh is equal to the height of conductive solder 108. In some embodiments, a ratio of the height of conductive solder 108 to height Bh ranges from about 0.3 to about 2.0

Figure 3B:
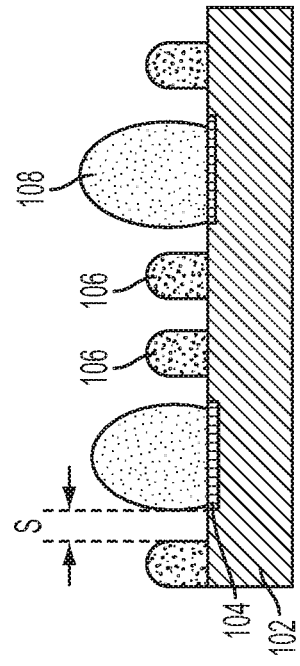

FIG. 3B is a cross-sectional view of an I/O area of a semiconductor device in accordance with one or more embodiments. In the arrangement of FIG. 3B, boundary structure 106 is spaced from conductive solder 108 by space S (FIG. 2C). In some embodiments, sidewalls of boundary structure 106 are aligned with an edge of conductive pad 104. In some embodiments, boundary structure 106 overlaps a portion of conductive pad 104. In some embodiments, boundary structure 106 covers an entirety of the I/O area not covered by conductive pads 104. In the arrangement of FIG. 3B, height Bh is less than a height of conductive solder 108.

Figure 3C:
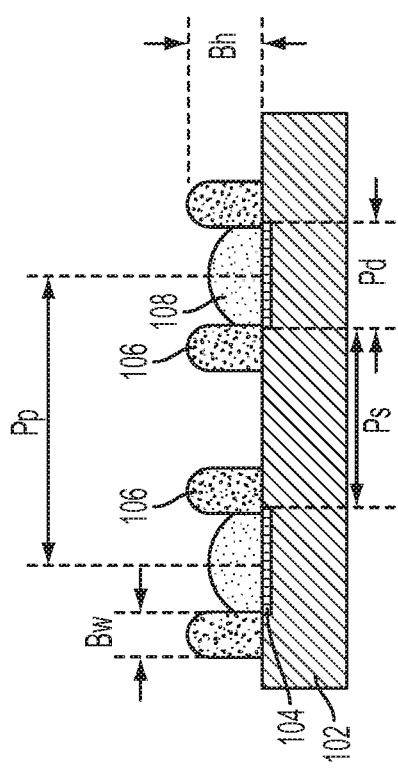

FIG. 3C is a cross-sectional view of an I/O area of a semiconductor device in accordance with one or more embodiments. In the arrangement of FIG. 3C, boundary structure 106 is separated from conductive solder 108. In some embodiments, boundary structure 106 is in a continuous grid pattern. In some embodiments, boundary structure 106 is in a discontinuous grid pattern. In the arrangement of FIG. 3C, height Bh is greater than a height of conductive solder 108. In some embodiments, height Bh is equal to the height of conductive solder 108.

Figure 3D:
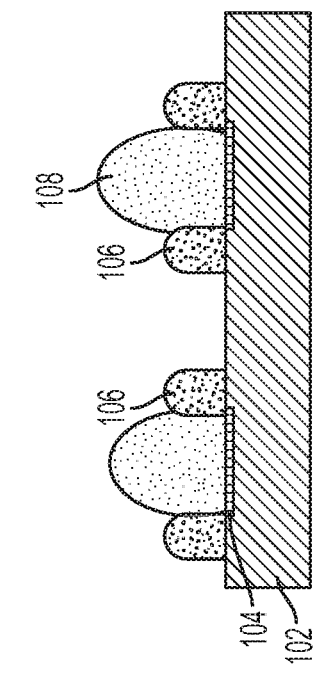

FIG. 3D is a cross-sectional view of an I/O area of a semiconductor device in accordance with one or more embodiments. In the arrangement of FIG. 3D, boundary structure 106 is spaced from conductive solder 108 by space S. In some embodiments, boundary structure 106 is in a continuous grid pattern. In some embodiments, boundary structure 106 is in a discontinuous grid pattern. In the arrangement of FIG. 3D, height Bh is less than a height of conductive solder 108.

Figure 4:
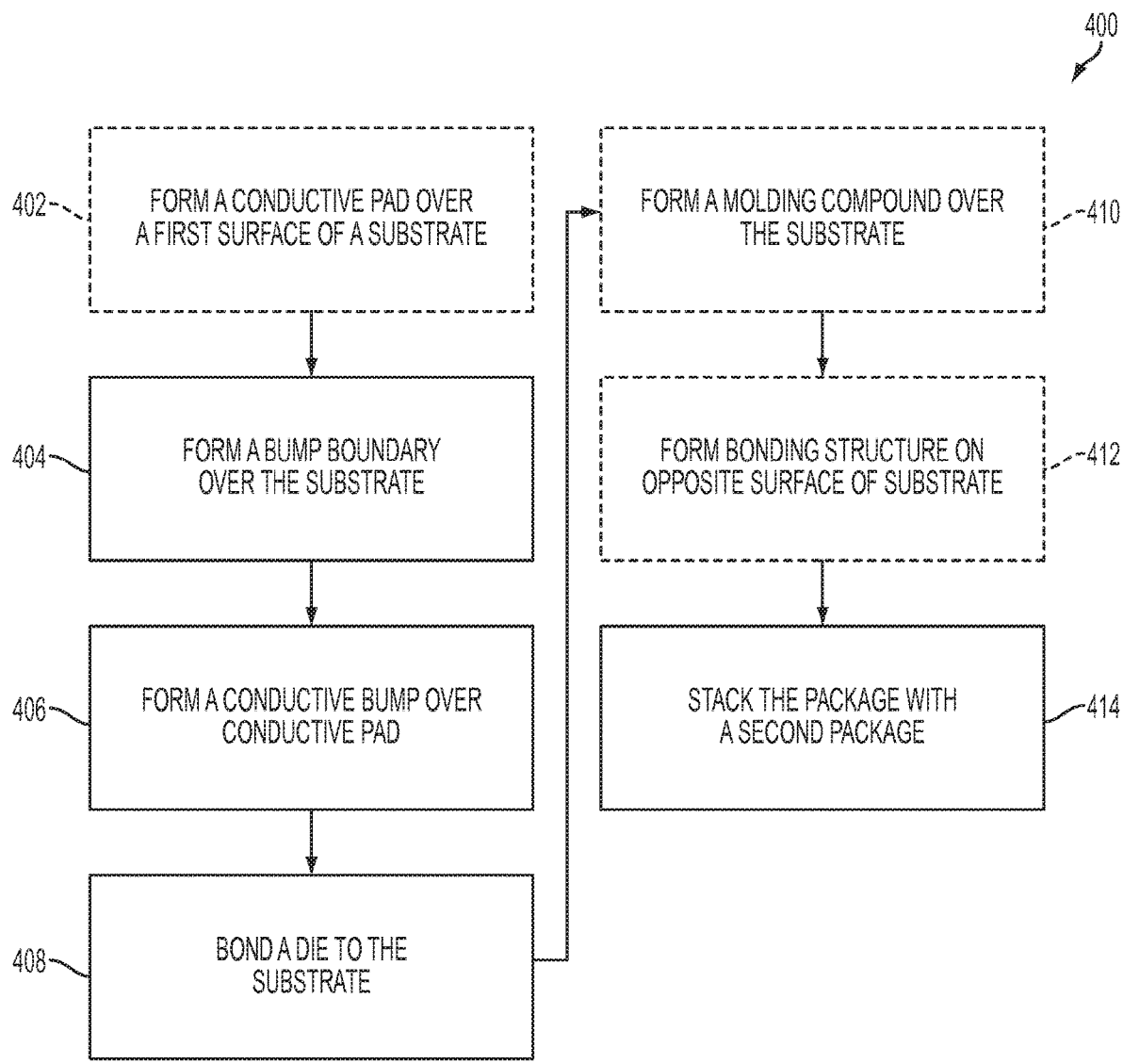
FIG. 4 is a flow chart of a method of making a package-on-package (PoP) structure in accordance with one or more embodiments.

FIG. 4 is a flow chart of a method 400 of making a PoP structure in accordance with one or more embodiments. In operation 402, a conductive pad is formed over a first surface of a substrate. In some embodiments, the conductive pad is formed as a top layer of an interconnect structure. In some embodiments, the conductive pad includes copper, aluminum, tungsten, conductive polymer, or another suitable conductive material. In some embodiments, a substrate is purchased from a supplier which already includes conductive pads, so operation 402 is omitted.

Figure 5A:
FIGS. 5A-5F are cross-sectional views of intermediate structures of a PoP structure during a method of making the PoP structure in accordance with one or more embodiments.

FIG. 5A is a cross-sectional view of a substrate structure following operation 402 in accordance with one or more embodiments. The PoP structure includes conductive pad 104 over substrate 102. In some embodiments, the PoP structure further includes through via connected to conductive pad 104.

Returning to FIG. 4, in operation 404, a boundary structure over the substrate. In some embodiments, the boundary structure is formed using a screening process. In some embodiments, the boundary structure is formed using a mask. In some embodiments, the boundary structure is formed by pressing a pasting material through a mask and pasting the boundary structure material to the substrate using the pasting material. In some embodiments, sidewalls of the boundary structure are aligned with edges of the conductive pad. In some embodiments, the boundary structure overlaps with the conductive pad. In some embodiments, the boundary structure is spaced from the conductive pad. In some embodiments, the boundary structure forms a continuous grid pattern. In some embodiments, the boundary structure forms a discontinuous grid pattern. In some embodiments, the boundary structure covers an entirety of an I/O area of the substrate. In some embodiments, the boundary structure includes a silicon-based adhesive.

Figure 5B:

FIG. 5B is a cross-sectional view of a PoP structure following operation 404 in accordance with one or more embodiments. The PoP structure includes boundary structure 106 over substrate 102. The sidewalls of boundary structure 106 are aligned with the edges of conductive pad 104.

Returning to FIG. 4, in operation 406 a conductive bump is formed over the conductive pad. The conductive bump is electrically connected to the conductive pad. In some embodiments, the conductive bump includes a solder ball, a copper ball, a copper pillar or another suitable bump. In some embodiments, the conductive bump further includes an under bump metallurgy (UBM) layer over the conductive pad. In some embodiments, the conductive bump further includes a passivation layer or a polymer layer over the conductive pad.

In some embodiments, the conductive bump is formed by a screen process, a solder mask process or another suitable formation process. In some embodiments, the conductive bump is formed to have a height equal to or greater than a height of the boundary structure. In some embodiments, the conductive bump is formed to have a height less than the height of the boundary structure. In some embodiments, the conductive bump is formed in contact with the boundary structure. In some embodiments, the conductive bump is formed spaced from the boundary structure.

Figure 5C:
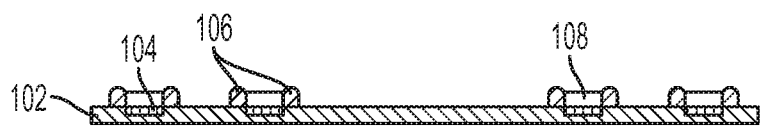

FIG. 5C is a cross-sectional view of a PoP structure following operation 406 in accordance with one or more embodiments. The PoP structure includes conductive solder 108 over conductive pad 104. Conductive solder 108 is in contact with boundary structure 106. Conductive solder 108 has a height less than the height of boundary structure 106.

Returning to FIG. 4, in operation 408 a die is bonded to the substrate. In some embodiments, the die is bonded to the substrate using an epoxy or another suitable adhesive material. In some embodiments, the die is solder bonded to the substrate. In some embodiments, the die is electrically connected to an interconnect structure on the substrate.

Figure 5D:
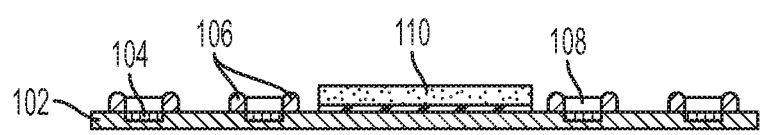

FIG. 5D is a cross-sectional view of a PoP structure following operation 408 in accordance with one or more embodiments. The PoP structure includes die 110 bonded to substrate 102. Die 110 is bonded to substrate by an epoxy.

Returning to FIG. 4, in operation 410 a molding compound is formed over the substrate. In some embodiments, the molding compound is formed between adjacent boundary structures. In some embodiments, the molding compound is formed over an I/O area of the PoP structure. In some embodiments, the molding compound is formed over only a portion of the I/O area of the PoP structure. In some embodiments, the molding compound is formed over all exposed areas of the substrate. In some embodiments, the molding compound includes epoxy resin mold compound. In some embodiments, the molding compound includes plastics, resins, epoxies, adhesives, hardeners, catalysts, release agents, or other suitable materials In some embodiments, the molding compound additional includes fillers used to adjust the coefficient of thermal expansion ("CTE"), control water absorption, and control elasticity or modulus of the finished mold compound. In some embodiments, the molding compound is formed using a mask, a screening process or another suitable formation process. In some embodiments, operation 410 is omitted.

Figure 5E:
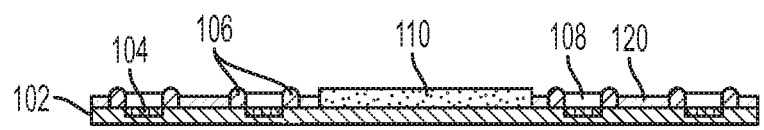

FIG. 5E is a cross-sectional view of a PoP structure following operation 410 in accordance with one or more embodiments. The PoP structure includes molding compound 120 over substrate 102. Molding compound 120 is fills all exposed portions of substrate 102 and provides additional mechanical strength to boundary structure 106.

Returning to FIG. 4, in operation 412 a bonding structure is formed on an opposite surface of the substrate. In some embodiments, the bonding structure includes a solder ball, a copper ball, a copper pillar or another suitable bonding structure. In some embodiments, the bonding structure is connected to respective conductive pads by through vias. In some embodiments, the bonding structure is aligned with the conductive pads. In some embodiments, the bonding structure is located in an I/O area of the PoP structure. In some embodiments, the bonding structure is also located under the die. In some embodiments, the bonding structure is electrically connected to the die through vias. In some embodiments, operation 412 is omitted.

Figure 5F:
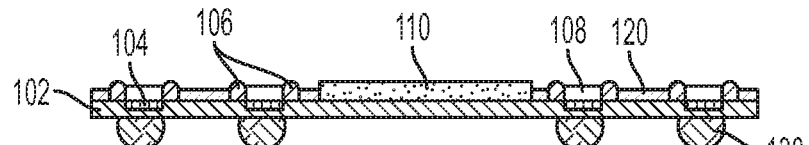

FIG. 5F is a cross-sectional view of a PoP structure following operation 412 in accordance with one or more embodiments. The PoP structure includes bonding structure 130 on the bottom surface of substrate 102. Bonding structure 130 enable substrate 102 to be bonded to a package on both the top surface and the bottom surface of the substrate.

Returning to FIG. 4, in operation 414 the package is stacked with a second package. The substrate is stacked with the second substrate pressing the package and the substrates together and heating the assembly to reflow at least a portion of the conductive bump to electrically connect the package to the second package. In some embodiments, the second substrate includes a boundary structure. In some embodiments, the boundary structure of the second substrate contacts the boundary structure of the substrate. In some embodiments, the boundary structure of the second substrate encloses the boundary structure of the substrate. In some embodiments, the boundary structure of the second substrate is staggered with respect to the boundary structure of the substrate.

Following operation 414, the PoP structure resembles a structure similar to those of FIGS. 6A-6E, described below, in some embodiments.

One of ordinary skill will recognize additional operations are possible. The additional operations include filling a space between the substrate and the second substrate with an underfill material, forming an underfill material between the substrate and the boundary structure, forming an additional boundary structure over the boundary structure, or other suitable operations.

Figure 6A:
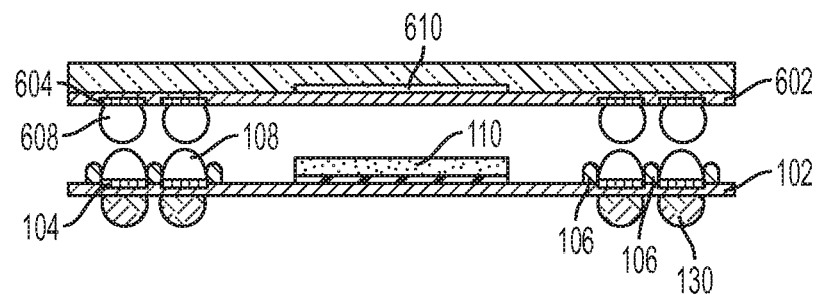
FIGS. 6A-6E are cross-sectional views of pre-bonding PoP structures having boundary structures in accordance with one or more embodiments.

FIG. 6A is a cross-sectional view of a pre-bonding PoP structure having boundary structures in accordance with one or more embodiments. The arrangement of FIG. 6A includes a first package similar to semiconductor device 100 of FIG. 1. Similar elements share a same reference number. The first package also includes bonding structures 130 on the bottom surface of substrate 102. Conductive pads 104 are connected to respective bonding structures 130. In some embodiments, conductive pads 104 are connected to respective bonding structures by through via.

The arrangement of FIG. 6A includes a second package. The second package includes a substrate 602 having conductive pads 604. The second package includes conductive solder 608 in electrical contact with conductive pads 604. The second package includes a die 610 on substrate 602.

During a packaging process, the first package and the second package are pressed together so that conductive solder 108 contacts conductive solder balls 608 to form an electrical connection between the first package and the second package. Boundary structure 106 reduces the risk of conductive solder 108 or conductive solder balls 608 from expanding to form a bridge with an adjacent set of conductive solder balls 108/608. By preventing bridging between adjacent sets of conductive solder balls 108/608, boundary structure 106 helps to increase production yield and enable reduced pad pitch Pp for the first package and the second package.

Figure 6B:
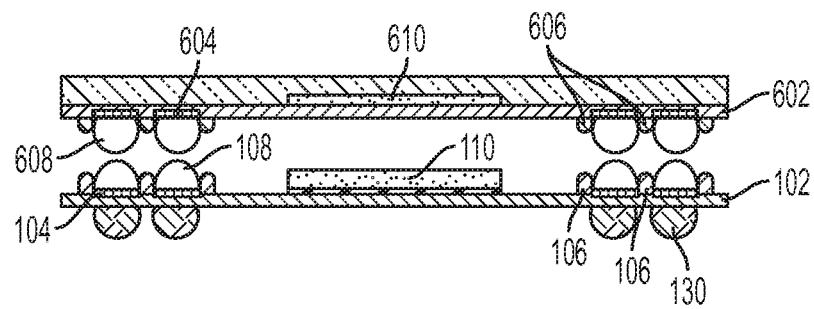

FIG. 6B is a cross-sectional view of a pre-bonding PoP structure having boundary structures in accordance with one or more embodiments. In comparison with FIG. 6A, the arrangement of FIG. 6B includes boundary structure 606 surrounding conductive pads 604. In some embodiments, sidewalls of boundary structure 606 are aligned with an edge of conductive pad 604. In some embodiments, boundary structure 606 overlaps with a portion of conductive pad 604. Conductive solder 108 are aligned with conductive solder balls 608.

During a packaging process, the first package and the second package are pressed together so that conductive solder 108 contact conductive solder balls 608 to form an electrical connection between the first package and the second package. In some embodiments, boundary structure 606 contacts boundary structure 106. Boundary structure 106 and boundary structure 606 reduce the risk of conductive solder 108 or conductive solder balls 608 from expanding to form a bridge with an adjacent set of conductive solder balls 108/608. By preventing bridging between adjacent sets of conductive solder balls 108/608, boundary structure 106 and boundary structure 606 help to increase production yield and enable reduced pad pitch Pp for the first package and the second package.

Figure 6C:
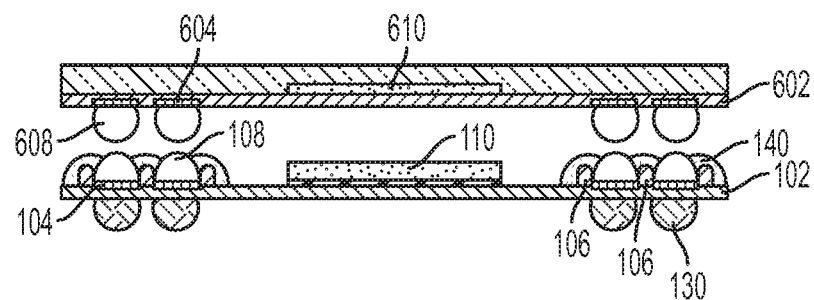

FIG. 6C is a cross-sectional view of a pre-bonding PoP structure having boundary structures in accordance with one or more embodiments. In comparison with FIG. 6A, the arrangement of FIG. 6C includes additional boundary structure 140. Additional boundary structure 140 is over boundary structure 106 and provides additional barrier to avoid bridge risk. In some embodiments, additional boundary structure 140 includes a same material as boundary structure 106. In some embodiments, additional boundary structure 140 includes a different material from boundary structure 106. Additional boundary structure 140 is formed after conductive solder 108. In some embodiments, the second package also includes boundary structures 406.

During a packaging process, the first package and the second package are pressed together so that conductive solder 108 contacts conductive solder balls 608 to form an electrical connection between the first package and the second package. Boundary structure 106 and additional boundary structure 140 reduce the risk of conductive solder 108 or conductive solder balls 608 from expanding to form a bridge with an adjacent set of conductive solder balls 108/608. By preventing bridging between adjacent sets of conductive solder balls 108/608, boundary structure 106 and additional boundary structure 140 help to increase production yield and enable reduced pad pitch Pp for the first package and the second package.

Figure 6D:
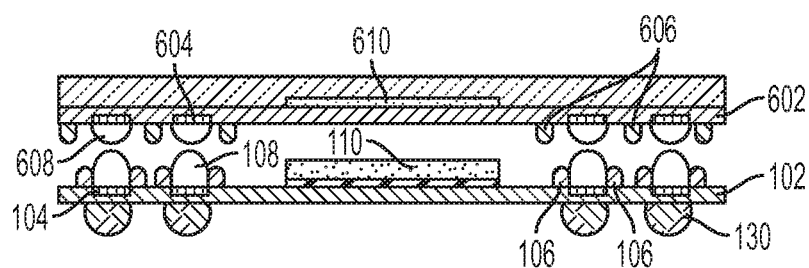

FIG. 6D is a cross-sectional view of a pre-bonding PoP structure having boundary structures in accordance with one or more embodiments. In comparison with FIG. 6A, the arrangement of FIG. 6D includes boundary structure 606 separated from conductive pads 604. In some embodiments, boundary structure 606 forms a discontinuous grid pattern. In some embodiments, boundary structure 606 forms a continuous grid pattern. Boundary structure 606 is offset with boundary structure 106.

During a packaging process, the first package and the second package are pressed together so that conductive solder 108 contacts conductive solder balls 608 to form an electrical connection between the first package and the second package. In some embodiments, boundary structure 606 is positioned so that in the PoP structure boundary structure 606 is positioned between adjacent boundary structures 106. Boundary structure 106 and boundary structure 606 reduce the risk of conductive solder 108 or conductive solder balls 408 from expanding to form a bridge with an adjacent set of conductive solder balls 108/608. By preventing bridging between adjacent sets of conductive solder balls 108/608, boundary structure 106 and boundary structure 606 help to increase production yield and enable reduced pad pitch Pp for the first package and the second package.

Figure 6E:
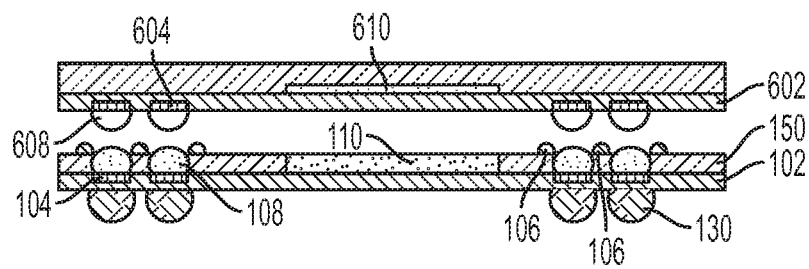

FIG. 6E is a cross-sectional view of a pre-bonding PoP structure having boundary structures in accordance with one or more embodiments. In comparison with FIG. 6A, the arrangement of FIG. 6E includes exposed molding compound 150 on the first package. Exposed molding compound 150 is positioned between substrate 102 and boundary structure 106. Exposed molding compound 150 provides additional mechanical strength and additional height to boundary structure 106. In some embodiments, conductive solder 108 are formed over respective conductive pads 104. Exposed molding compound 150 is then formed over the exposed portions of substrate 102. In some embodiments, exposed molding compound 150 is formed using a mask, a screening process, or another suitable formation process. Boundary structure 106 is then formed over molding compound 150. In some embodiments, exposed molding compound 150 includes a same material as molding compound 120. In some embodiments, exposed molding compound 150 is formed over the I/O area of the first package. In some embodiments, exposed molding compound 150 is formed over only a portion of the I/O area of the first package. In some embodiments, exposed molding compound 150 is formed over an entirety of the first package.

During a packaging process, the first package and the second package are pressed together so that conductive solder 108 contacts conductive solder balls 608 to form an electrical connection between the first package and the second package. Boundary structure 106 and exposed molding compound 150 reduce the risk of conductive solder 108 or conductive solder balls 608 from expanding to form a bridge with an adjacent set of conductive solder balls 108/608. By preventing bridging between adjacent sets of conductive solder balls 108/608, boundary structure 106 and exposed molding compound 150 help to increase production yield and enable reduced pad pitch Pp for the first package and the second package.

Figure 7A:
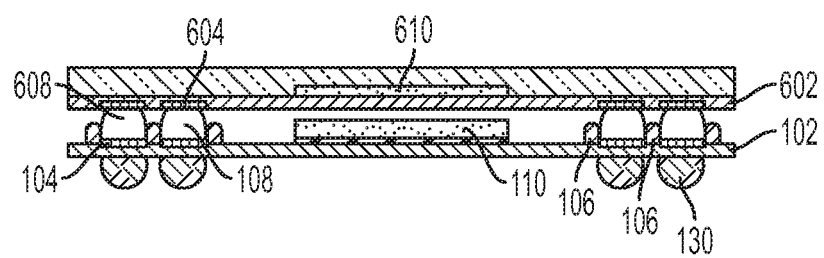
FIGS. 7A and 7B are cross-sectional views of PoP structures having boundary structures in accordance with one or more embodiments.

FIG. 7A is a cross-sectional view of a PoP structure having boundary structures in accordance with one or more embodiments. The PoP structure of FIG. 7A includes a structure similar to FIG. 6A. Similar elements share a same reference number. In the PoP structure of FIG. 7A, substrate 102 and substrate 602 are bonded together to form a bonded package structure. The conductive solder 108/608 is prevented from bridging to adjacent conductive solder structures by boundary structure 106.

Figure 7B:
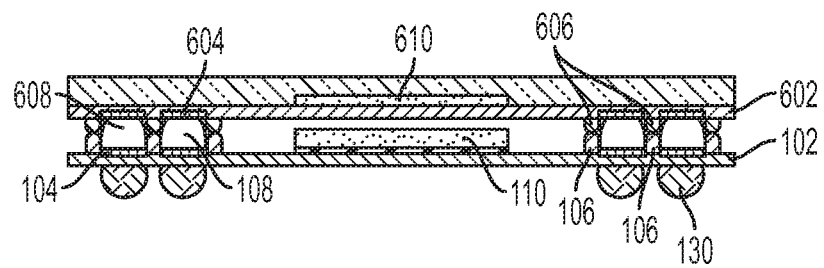

FIG. 7B is a cross-sectional view of a PoP structure having boundary structures in accordance with one or more embodiments. The PoP structure of FIG. 7B includes a structure similar to FIG. 6B. Similar elements share a same reference number. In the PoP structure of FIG. 7B, substrate 102 and substrate 602 are bonded together to form a bonded package structure. The conductive solder 108/608 is prevented from bridging to adjacent conductive solder structures by boundary structure 106. Also boundary structure 606 contacts boundary structure 106. The contacting boundary structures further reduce the risk of bridging. The contacting boundary structures are also usable to help determine a standoff distance between substrate 102 and substrate 602.

Figure 8:
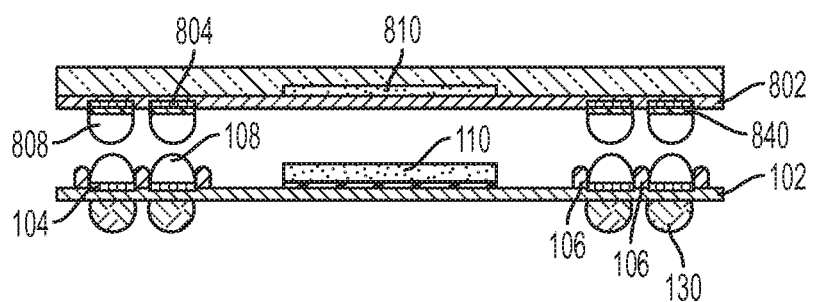
FIG. 8 is a cross-sectional view of pre-bonding PoP structures having boundary structures in accordance with one or more embodiments.

FIG. 8 is a cross-sectional view of a pre-bonding PoP structure having boundary structures in accordance with one or more embodiments. The pre-bonding PoP structure of FIG. 8 includes a structure similar to FIG. 6A. Similar elements share a same reference number. In comparison with FIG. 6A, the arrangement of FIG. 8 includes a copper ball 808 in place of conductive solder 608 (FIG. 6A). During a bonding process, copper ball 808 forms an electrical connection with conductive solder 108. An adhesion layer 840 is between copper ball 808 and conductive pad 804 to help maintain a positional relationship between the copper ball and the conductive pad. In some embodiments, adhesion layer 840 includes a solder paste or other suitable adhesion enhancing material. One of ordinary skill will recognize that additional embodiments of described above are usable with a copper ball in place of conductive solder.

Including boundary structure 106 in a semiconductor device helps to prevent bridging between adjacent conductive solder 108 during a packaging process. During a packaging process, the conductive solder 108 is melted to allow the conductive solder to flow around a conductive element of a top package. In instances which include BGA as part of the top package, more solder material is introduced which tends to cause conductive solder 108 to expand outwardly during the packaging process. Boundary structure 106 acts to prevent the outward expansion of conductive solder 108 to reduce the risk of bridging. As a result, pad pitch Pp is able to be reduced. In some embodiments, pad pitch Pp ranges from about 50 .mu.m to about 200 .mu.m. In contrast, a pitch between adjacent conductive pads in a semiconductor device which does not include boundary structure 106 is greater than 0.3 millimeters (mm).

In some instances, boundary structure 106 also helps with alignment during a bonding process by contacting a boundary structure or another alignment structure of the top package. In some instances, boundary structure 106 also helps to determine a standoff distance sufficient to facilitate filling of a space between packages with an underfill material.

One aspect of this description relates to a semiconductor device. The semiconductor device includes a substrate and a first conductive pad on a top surface of the substrate. The semiconductor device further includes a boundary structure on the top surface of the substrate around the conductive pad.

Another aspect of this description relates to a package on package (PoP) structure. The PoP structure includes a first package. The first package includes a first substrate and a first plurality of conductive pads on a top surface of the first substrate. The first package further includes a first plurality of conductive solder material, each conductive solder material of the first plurality of conductive solder material electrically connected to a respective conductive pad of the first plurality of conductive pads. The first package further includes a first boundary structure separating each conductive pad of the first plurality of conductive pads from an adjacent conductive pad of the first plurality of conductive pads. The PoP structure further includes a second package bonded to the first package. The second package includes a second substrate and a second plurality of conductive pads on a top surface of the second substrate. The second package further includes a second plurality of conductive solder material, each conductive solder material of the second plurality of conductive solder material electrically connected to a respective conductive pad of the second plurality of conductive pads, wherein at least one conductive solder material of the second plurality of conductive solder material is bonded to at least one conductive solder material of the first plurality of conductive solder material.

Still another aspect of this description relates to a method of making a semiconductor device. The method includes forming a boundary structure on a first surface of a substrate having a conductive pad on the first surface. The method further includes forming a conductive solder material on the conductive pad.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

The invention claimed is:

1. A semiconductor structure, comprising:
    a substrate;
    a first conductive pad arranged over the substrate; and
    a boundary structure on an upper surface of the substrate around the first conductive pad, wherein the boundary structure has one or more sidewalls defining an opening with a round shape over the first conductive pad, and the boundary structure has a bottommost surface that overlaps the first conductive pad.

2. The semiconductor structure of claim 1, wherein the one or more sidewalls of the boundary structure are directly over an upper surface of the first conductive pad.

3. The semiconductor structure of claim 1, further comprising:
    a second conductive pad arranged over the substrate; and
    a second boundary structure over the substrate and having one or more sidewalls defining a second opening with a round shape over the second conductive pad, wherein the boundary structure has an outer sidewall that is separated from an outer sidewall of the second boundary structure by a non-zero distance.

4. The semiconductor structure of claim 3, wherein the one or more sidewalls of the second boundary structure are directly over an upper surface of the second conductive pad.

5. The semiconductor structure of claim 1, wherein the boundary structure has an arched top surface with a continuous curvature facing away from the substrate and directly coupled to opposing sidewalls of the boundary structure.

6. An integrated chip package structure, comprising:
    a first conductive pad and a second conductive pad arranged over an upper surface of a substrate;
    a first boundary structure arranged over the upper surface of the substrate and around the first conductive pad; and
    a second boundary structure arranged over the upper surface of the substrate and around the second conductive pad, wherein the first and second boundary structures are between the first and second conductive pads, wherein bottommost surfaces of the first and second boundary structures are directly above the first and second conductive pads, and wherein the first boundary structure is laterally separated from the second boundary structure by a non-zero distance.

7. The integrated chip package structure of claim 6, further comprising:
    a molding compound continuously extending between a first sidewall contacting the first boundary structure and a second sidewall contacting the second boundary structure.

8. The integrated chip package structure of claim 7, wherein a horizontal plane extending along a top of the molding compound extends through the first boundary structure and the second boundary structure.

9. The integrated chip package structure of claim 6, further comprising:
    a die disposed over the upper surface of the substrate, wherein the first conductive pad and the second conductive pad are disposed along a same side of the die.

10. The integrated chip package structure of claim 6, wherein the first boundary structure continuously extends between sidewalls of the first boundary structure, as viewed along a cross-sectional view, for a first lateral distance that is smaller than a second lateral distance between the first conductive pad and the second conductive pad.

11. The semiconductor structure of claim 1, further comprising:
    a conductive solder disposed over the first conductive pad, wherein the conductive solder protrudes outward from directly between the one or more sidewalls of the boundary structure to above the one or more sidewalls of the boundary structure.

12. The semiconductor structure of claim 1, further comprising:
    a conductive solder having a bottom surface contacting an upper surface of the first conductive pad, wherein the upper surface of the first conductive pad continuously extends past opposing outermost edges of the bottom surface of the conductive solder.

13. The semiconductor structure of claim 1, further comprising:
    a conductive solder disposed over the first conductive pad, wherein the conductive solder has outermost sidewalls that are recessed below a top of the boundary structure.

14. The semiconductor structure of claim 1, further comprising:
    a conductive solder disposed over the first conductive pad, wherein a top of the boundary structure is laterally separated from an imaginary vertical line extending along an outermost sidewall of the conductive solder by a non-zero lateral distance extending over the boundary structure.

15. The semiconductor structure of claim 1, wherein a top of the boundary structure is laterally separated from an imaginary vertical line extending along an outermost sidewall of the first conductive pad by a non-zero lateral distance extending over the boundary structure.

16. A semiconductor structure, comprising:
a substrate;
a first conductive pad arranged over the substrate;
a boundary structure disposed on an upper surface of the substrate around the first conductive pad; and
a molding compound disposed on the substrate and along a sidewall of the boundary structure, wherein a topmost edge of a sidewall of the molding compound that faces towards the first conductive pad is a non-zero distance below a topmost surface of the boundary structure.

17. The semiconductor structure of claim 16, further comprising:
a conductive solder disposed over the first conductive pad, wherein the top of the boundary structure is laterally separated from a second imaginary vertical line extending along an outermost sidewall of the conductive solder by a second non-zero lateral distance extending over the boundary structure.

18. The semiconductor structure of claim 16, further comprising:
a second conductive pad disposed over the substrate and separated from the first conductive pad by the boundary structure, wherein the molding compound has a first maximum height between the first conductive pad and the second conductive pad that is smaller than a second maximum height of the boundary structure.

19. The semiconductor structure of claim 16, further comprising:
a second conductive pad over the substrate;
a second boundary structure on the upper surface of the substrate around the second conductive pad; and
wherein the molding compound is disposed over the substrate and havs an uppermost surface continuously extending between the boundary structure and the second boundary structure.

20. The semiconductor structure of claim 16, further comprising:
a second conductive pad disposed over the substrate and separated from the first conductive pad by the boundary structure, wherein the boundary structure contacts the upper surface of the substrate and the molding compound extends to the upper surface of the substrate between the first conductive pad and the second conductive pad.

* * * * *